(12) United States Patent
Morales

(10) Patent No.: US 6,655,950 B2
(45) Date of Patent: Dec. 2, 2003

(54) PRINTED CIRCUIT BOARD EDGE SHAPING TOOL

(75) Inventor: Refugio C. Morales, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 294 days.

(21) Appl. No.: 09/903,912

(22) Filed: Jul. 12, 2001

(65) Prior Publication Data

US 2002/0006453 A1 Jan. 17, 2002

Related U.S. Application Data

(62) Division of application No. 09/383,862, filed on Aug. 26, 1999, now Pat. No. 6,368,540.

(51) Int. Cl.$^7$ .............................................. B29C 59/02
(52) U.S. Cl. ........................ 425/374; 425/383; 425/394
(58) Field of Search ................................ 425/363, 374, 425/383, 394

(56) References Cited

U.S. PATENT DOCUMENTS

| | | | | |
|---|---|---|---|---|
| 4,028,036 A | * | 6/1977 | Farfor | 425/374 |
| 4,401,614 A | * | 8/1983 | DeSantis | 425/394 |
| 4,449,911 A | * | 5/1984 | Brasfiel | 425/374 |
| 4,687,267 A | | 8/1987 | Header et al. | 439/62 |
| 4,732,638 A | * | 3/1988 | Baker et al. | 425/335 |
| 5,226,361 A | | 7/1993 | Grant et al. | 101/44 |

OTHER PUBLICATIONS

Radoll's Gold Finger Beveling Products, Radoll Designs, Inc., Jul. 7, 1999.

* cited by examiner

*Primary Examiner*—James P. Mackey
(74) *Attorney, Agent, or Firm*—Workman Nydegger

(57) ABSTRACT

The present invention relates to a tool, and method of its use, that puts a pair of bevels onto an edge of a printed circuit board (PCB) so that the PCB can be inserted into an expansion slot of a computer. The tool has a bevel wheel, preferably with a bilaterally symmetrical angle channel shape, that is connected to a carriage. The bevel wheel rolls along the carriage while the bevel wheel is pressed onto the edge of the PCB so as to form the pair of bevels on the edge of the PCB. No material is removed from the PCB while forming the pair of bevels. The bevel wheel is forced upon the edge using a piston that monitors and regulates the pressure applied to the edge of the PCB in order to achieve a preferred height and angular orientation of the pair of bevels.

29 Claims, 14 Drawing Sheets

PRINTED CIRCUIT BOARD EDGE SHAPING TOOL

CROSS-REFERENCE TO RELATED APPLICATIONS

This is a divisional of U.S. patent application Ser. No. 09/383,862 filed on Aug. 26, 1999, now U.S. Pat. No. 6,368,540 which is incorporated herein by reference.

BACKGROUND OF THE INVENTION

1. The Field of the Invention

The present invention relates to a printed circuit board (PCB) having electronic components thereon, where the PCB is mounted into a connector. More particularly, the present invention relates to the shaping of one edge of a PCB for subsequent insertion of a substrate into a connector. In particular, the present invention relates to a printed circuit board cold-shaping tool that forms a bevel upon an insertion edge of the printed circuit board (PCB), where the bevel on the insertion edge is then inserted into an expansion slot of a computer system, and where the PCB is a memory module or any other kind of plug-in card.

2. The Relevant Technology

A printed circuit board, sometimes abbreviated PCB, is a thin plate on which chips and other electronic components are placed. Computers consist of one or more boards, often called cards or adapters, each of which has a plurality of electronic components thereon. A PCB is typically inserted into an expansion slot in order to place the electronic components thereon in electrical communication within the computer. The expansion slot is an opening in a computer where a printed circuit board can be inserted to add new capabilities to the computer. Nearly all personal computers, except for portable computers, contain expansion slots for adding more memory, graphics capabilities, and support for special devices. The boards inserted into the expansion slots are called expansion boards, expansion cards, cards, add-ins, and add-ons.

The PCB has electrical contacts that are in electrical communication with the electronic devices on the PCB. The PCB preferably has one or more bevels upon one edge in order to facilitate insertion thereof into an expansion slot for a digital computer, or other types of electronic devices. A smooth bevel is preferably formed along the edge of the card without disturbing the electrical contacts on the card. In a typical 72-pin card, the bevel has been conventionally formed by a cutting operation that removes material from the card. These cutting operations have typically been performed by machinery, such as with the Bevel Master[] or Bevel Mate[] each of which is distributed by Radoll Designs, Inc. located in the city of Thomasville, Ga., USA.

FIG. 1 is a cross-sectional elevation view of a prior art bevel device 10 that is used to cut a printed circuit board (PCB) 12 at an insertion edge 14 and at opposing parallel surfaces 30. PCB 12 is inserted into a slot 16 of a bevel jig 18. Bevel jig 18 may be supported by a base 20. As PCB 12 is advanced by forcing it through slot 16, a pair of knives 24 trim insertion edge 14 to form bevels. Insertion edge 14 is depicted as having a cross-sectional thickness that fits into and is slightly smaller than slot 16. During the trimming of insertion edge 14, a portion of PCB 12, called a trimming 26, falls away from PCB 12 and must be removed.

One of the problems that occurs in the prior art is that the presence of trimming 26 causes refuse and refuse management. Where a plurality of pins 28 are disposed along insertion edge 14 and have valuable metal such as gold that is cut away from PCB 12 as part of trimming 26, additional work must be carried out to recover and reuse the valuable metal in trimming 26.

Another problem that exists in the prior art is the fact that knives 24 are subject to losing a sharp edge and becoming dull due to on going use. As knives 24 begin to dull, successive PCBs will be beveled differently due to progressively varying degrees of sharpness of the cutting edge of knives 24. In other words, where printed circuit board 12 is the first to be trimmed by a brand new set of knives 24, a []clean[] cut may be performed, but the next printed circuit board will experience knives that are just slightly duller. Consequently, as the useful life of knives 24 nears their end, significantly different bevels on a PCB can be formed than when knives 24 are sharp.

Another problem occurs when one knife 24 may be sharper than another knife 24. An unevenness in sharpness during the beveling operation will cause a greater degree of friction on the duller knife 24. A difference or excessive friction on a knife 24 can cause PCB 12 to fragment instead of cleanly slicing insertion edge 14 of PCB 12. Also, the increased pressure against the duller blade of knife 24 will cause PCB 12 to bow or warp. Bowing or warping will in turn cause a greater volume of trimming 26 to be removed from either of surfaces 30 and/or insertion edge 30. Alternatively, if both occurrences of knives 24 are dull, the entire printed circuit board may be destroyed due to both uneven cutting, excessive friction, fragmentation, warping, or bowing. Still further, too large or too small of a volume of trimming 26 may be removed from one of opposite surfaces 30 of PCB 12. Consequently, an uneven formation of bevels may cause PCB 12 to be inserted into an expansion slot without proper registration in the slot. This improper registration can cause electrical communication between the expansion slot and the electric contacts on PCB 12 to be established on only one side of PCB 12.

Another problem that occurs due to the cutting nature of the prior art is, where the material of the pins 28 is scraped instead of cut by knives 24, the scraping causes the material of pins 28 to pull away from the surface 30. Where the material of pins 28 is harder than the material of PCB 12, or where the material of pins 28 is not efficiently bonded to the surface 30 of PCB 12, the material of pins 28 will be scraped away after a manner that causes it to delaminate from surface 30 of PCB 12. Consequently, the effect will be inadequate electrical contact when PCB 12 is inserted into an expansion slot.

Along the length of insertion edge 14 (the length is pictured as being perpendicular to the plane of the Figure), PCB 12 may have a varying cross-sectional thickness as PCB 12 is presented against knives 24. The varying cross-sectional thickness may also cause the cutting operation to be nonuniform. Where the cross-sectional thickness is too thin, cutting may not occur. Where the cross-sectional thickness is too wide, cutting may become irregular or improbable because PCB 12 may be forced out of slot 16.

What is needed in the art is a tool, and a method of using the same, that forms beveled edges in a printed circuit board while overcoming the problems of the prior art. Such a tool, and a method of its use, is disclosed and claimed herein.

BRIEF SUMMARY OF THE INVENTION

The present invention relates to a printed circuit board (PCB) edge shaping tool, and method of its use. The inventive tool and its method of use overcome the problems of the prior art associated with cutting and grinding to shape a PCB. The PCB has an insertion edge that extends between opposing parallel surfaces of the PCB. The PCB also has a bottom edge that is opposite and parallel to the insertion edge. The inventive tool is used to form a bevel on the PCB without removing material from the PCB. The bevel formed by the inventive method of using the inventive tool extends between the insertion edge and each of the opposing parallel surfaces of the PCB.

The inventive tool includes a support surface for supporting the bottom edge of the PCB, and also includes a device for moving a shaping tool to form a bevel on the PCB without removing material from the PCB. The bevel is formed while the support surface supports the bottom edge of the PCB and while the shaping tool makes contact with both the insertion edge of the PCB and the opposing parallel surfaces of the PCB.

The printed circuit board can be a memory module or for any other kind of plug-in card such as a modem card, a video card, or an audio card. The inventive method using compressive forces to form bevels upon an edge of a printed circuit board without removing material from the printed circuit board (PCB). Prior to the beveling operation of the present invention, the edge of the PCB has a first shape that preferably is rectangular in cross section. The first shape is transformed into a second shape, which is preferably beveled, by the inventive method. Once the bevels are formed, the bevels aide in the insertion and registration of the printed circuit board into an expansion slot of a computer chassis.

In one embodiment of the present invention, a rolling cold-shaping tool rolls along an edge of a printed circuit board in order to form preferred bevel shapes. The rolling cold-shaping tool can be a single bevel wheel or a collection of in-parallel bevel wheels that may perform the cold-shaping function upon an array of printed circuit boards that may be set in a tray or other collective container. The shape of the edge of a PCB is transformed into the beveled shaped by the shaped, bevel wheel. The bevel wheel has a bilaterally symmetrical angled channel shape into which the edge of the PCB is inserted. Compressive stresses directed at the edge of the PCB accomplish the formation of the bevel shape without removing material from the PCB.

The present invention also relates to a cold roll bevel system. The cold roll bevel system comprises a PCB insert assembly that comprises two parallel, opposed, spaced apart, slotted structures disposed against a plate. The plate may be varied in length to accommodate different length PCBs. An edge of the PCB is inserted into the PCB insert assembly and is then compressed in a compressive tool such as a shaped wheel, a channel, or an articulating press. The compression forms one or more bevels in the edge of the PCB without removing material from the PCB. Where the compressive tool is a wheel, the wheel is driven along the edge of the PCB into which the one or more bevels are to be formed. The present invention may be carried out by having an operator or a machine place a memory module or another PCB-mounted card into the PCB insert assembly. Where the length of the PCB may vary, the plate of the PCB insert assembly may be varied.

Under certain conditions, a plurality of memory modules may be processed to form bevels on an edge of the respective PCB according to the present invention. In particular, a plurality of parallel occurrences of a bevel wheel may be mounted upon a bevel wheel carriage and a corresponding plurality of memory module inserts may be disposed beneath the bevel wheel carriage. Under these circumstances, each occurrence of a bevel wheel may have a separate sensor in order to apply a preferred even pressure force upon each occurrence of the bevel edge.

In another embodiment of the present invention, formation of the bevel may be carried out by inserting the insertion edge of the PCB into a shaped channel. The insertion edge is then forcibly moved through the channel such that the insertion edge assumes the shape of the shaped channel without removing material from the PCB. As such, the insertion edge of the PCB will have a preferred bevel height and bevel angle. The shape of the channel in the present embodiment may be substantially the same, when viewed in cross section, as the shape of the bilaterally symmetrical channel of the shaped wheel of the previous embodiment.

In yet another embodiment of the present invention, the bevel may be formed by compression forces brought to bear upon the insertion edge of a PCB using the articulation of a press. The pressure upon the insertion edge forms bevels having both a bevel height and a bevel angle without removing material from the PCB. The cross-sectional view of such an articulating press in the present embodiment would be substantially the same when in a closed position of such a press as that of the bilaterally symmetrical channel of the shaped wheel of the previously described embodiment.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to figures wherein like structures will be provided with like reference designations. It is to be understood that the drawings are diagrammatic and schematic representations of embodiments of the present invention and are not limiting of the present invention nor are they necessarily drawn to scale.

Figure 1:
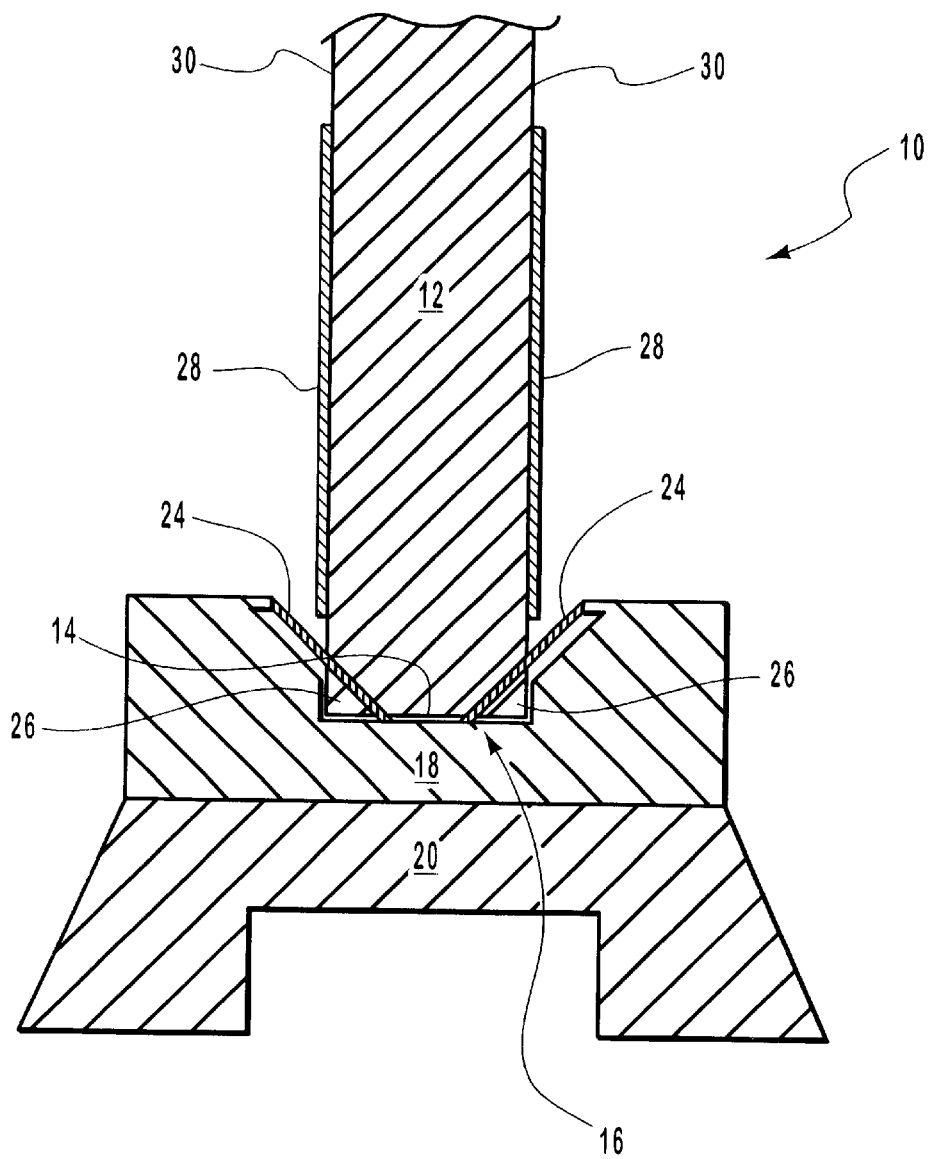
FIG. 1 is an elevational cross-sectional view of a prior art beveling device that forms beveled edges by cutting material away from a printed circuit board.
Figure 2:
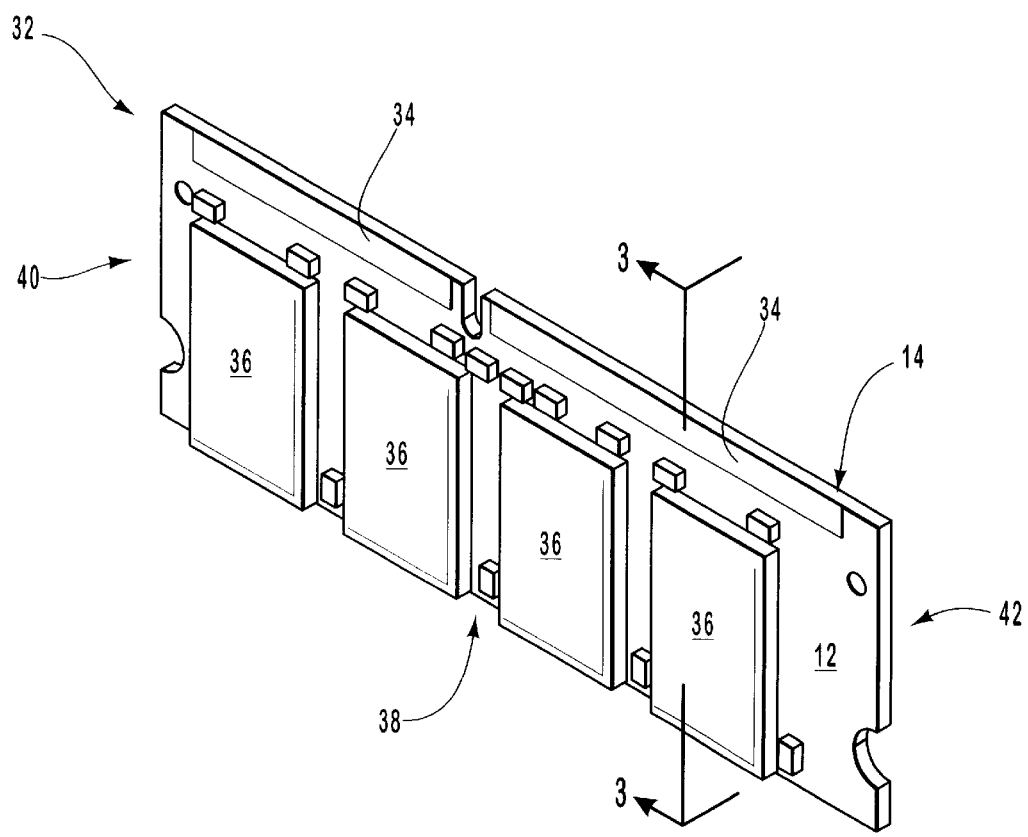
FIG. 2 is a perspective view of a memory module that may be beveled in the inventive printed board edge shaping tool.

FIG. 2 is an elevational perspective view of a package that may be a modem card, a graphics card, a memory card, or another plug-in card. In FIG. 2, the card is seen at reference numeral 32 as a memory module. Memory module 32 is shaped by use of the inventive printed circuit board edge shaping tool. Memory module 32 includes an insertion edge 14 that is inserted into an expansion slot of a computer chassis after it is beveled. Memory module 32 also includes a bottom edge 38 located opposite and parallel to insertion edge 14. A pin array 34 is disposed along insertion edge 14. Other edges of memory module 32 are a bottom edge 38 that is opposite and parallel to insertion edge 14, and a leading edge 40 that is opposite and parallel to a trailing edge 42. Memory module 32 may include a printed circuit board (PCB) 12 and at least one device 36, such as a microelectronic chip.

Figure 3:
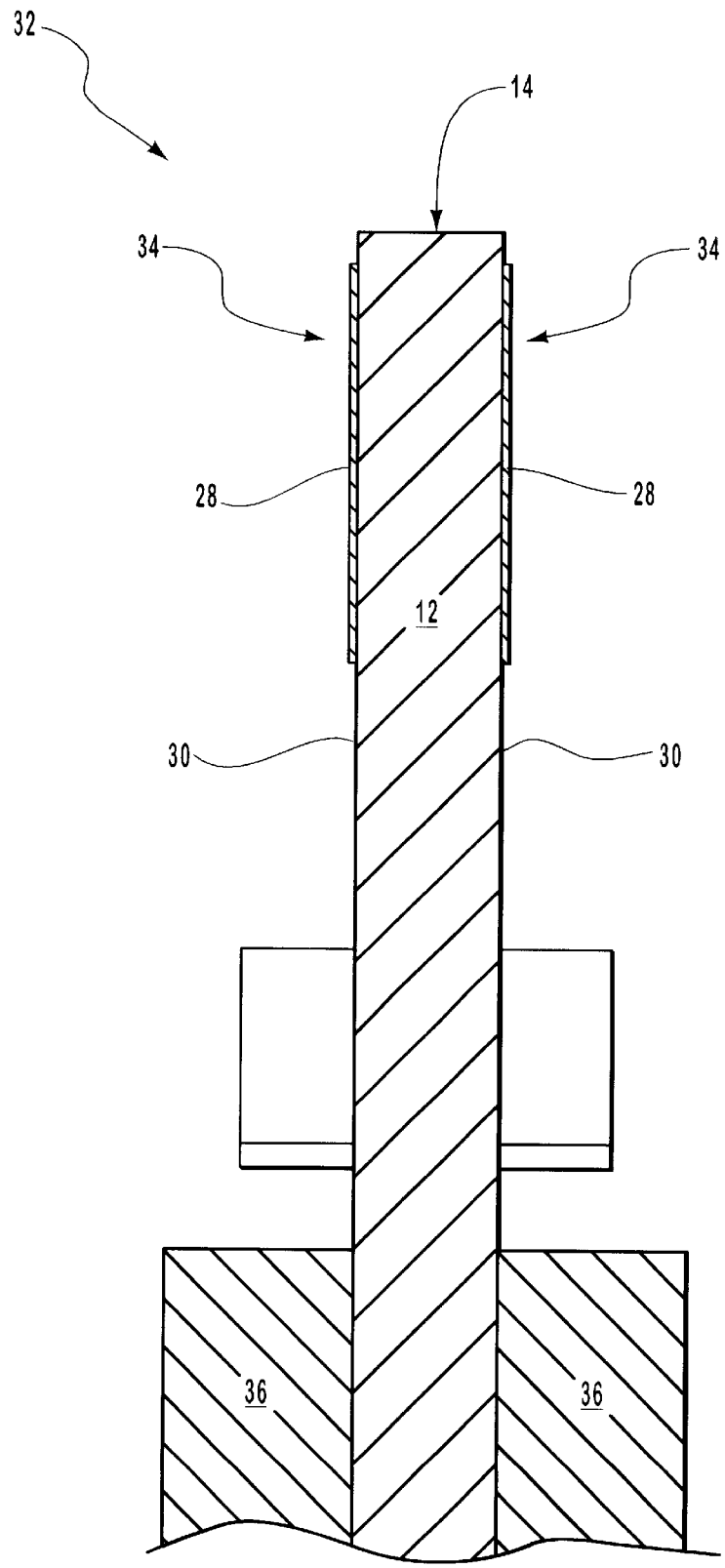
FIG. 3 is an elevational cross-section view taken along the section line 3—3 from FIG. 2.
Figure 4:
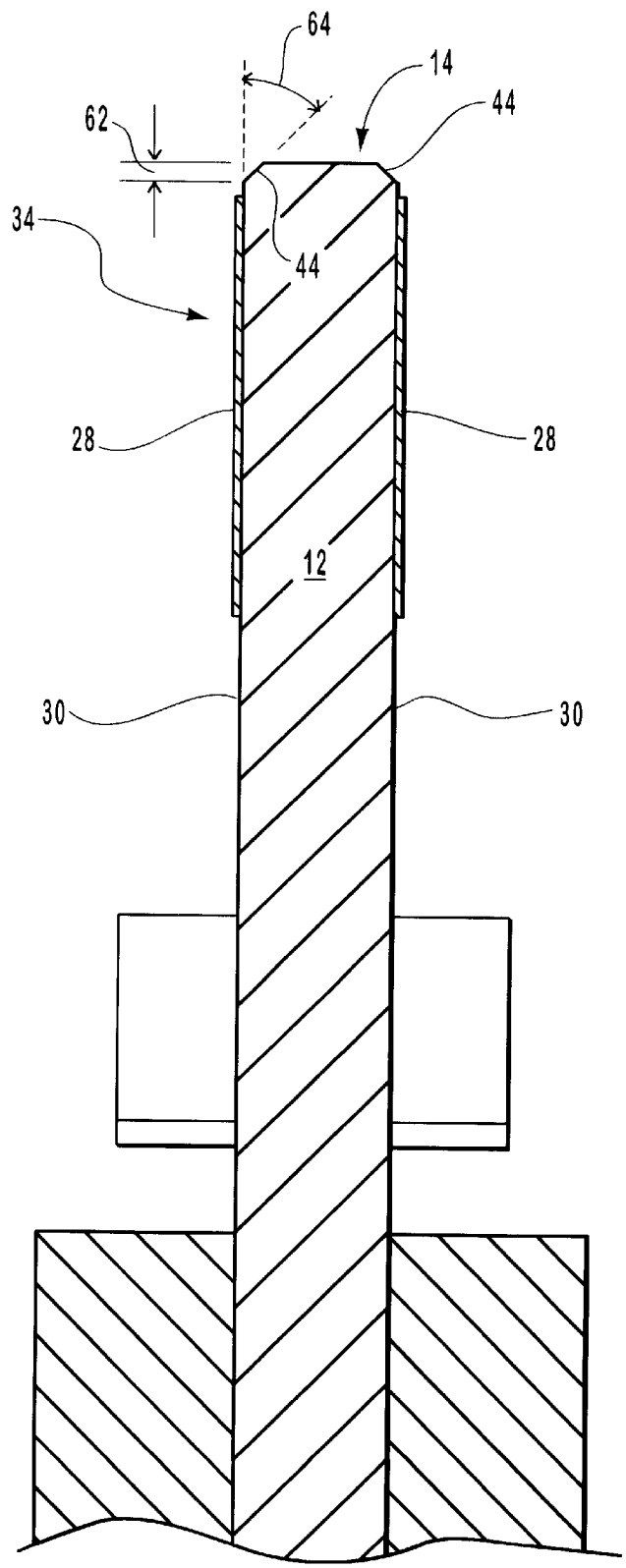
FIG. 4 is an elevational cross-section view illustrating the bevel formed on the bevel edge of the printed circuit board depicted in FIG. 3.

FIG. 3 is an elevational cross-section view taken along the section line 3—3 from FIG. 2 that illustrates memory module 32 with pin array 34 prior to the formation of a bevel. FIG. 3 illustrates PCB 12 having pins 28 disposed upon the surface 30 of PCB 12. The formation of a bevel is to be carried out at insertion edge 14. FIG. 4 is an elevational cross-section view illustrating an example of a bevel 44 that is formed from surfaces 30 and insertion edge 14 of PCB 12 using the inventive method. The right angle between insertion edge 14 and surface 30 in FIG. 3 is converted into bevel 44 seen in FIG. 4.

FIG. 4 illustrates that bevel 44 is made in this embodiment after a fashion that does that affect the structure of pins 28 disposed upon surface 30 of PCB 12. It is understood, however, that bevel 44 may be of sufficient size so as to include a portion of pins 28 upon the surface of bevel 44. Bevel 44 may have a bevel height 62 in a range from about 20 thousandths of an inch to about 1 thousandths of an inch. Preferably, bevel height 62 is in a range from about 2 thousandths of an inch to about 10 thousandths of an inch. Bevel 44 may also have a bevel angle 64 in a range from about 15° to about 60°, preferably in a range from about 20° to about 45°, and most preferably about 30°.

Figure 5:
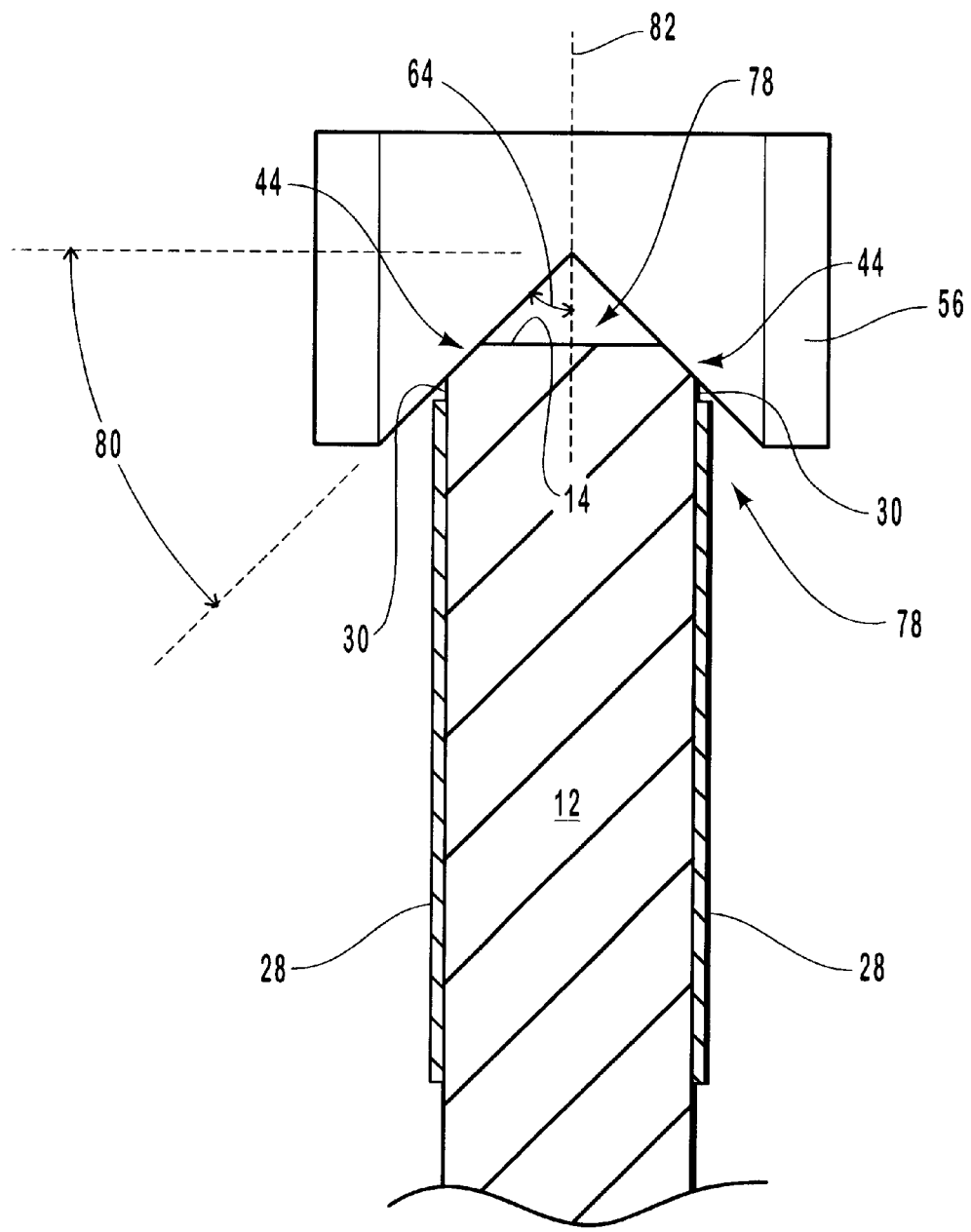
FIG. 5 is an elevational cross-section view illustrating the formation of a bevel within a bevel wheel according to the invention.

FIG. 5 is an elevational cross-section view of PCB 12 during the formation of bevel 44. A bevel wheel 56 is illustrated as being a shaped wheel having a bilaterally symmetrical angled channel 78 into which PCB 12 is inserted at insertion edge 14. Compressive stresses directed at insertion edge 14 at the juncture of insertion edge 14 and surface 30 accomplish the formation of bevel 44. An angle 80 is illustrated as being 90° minus bevel angle 64.

Figure 6:
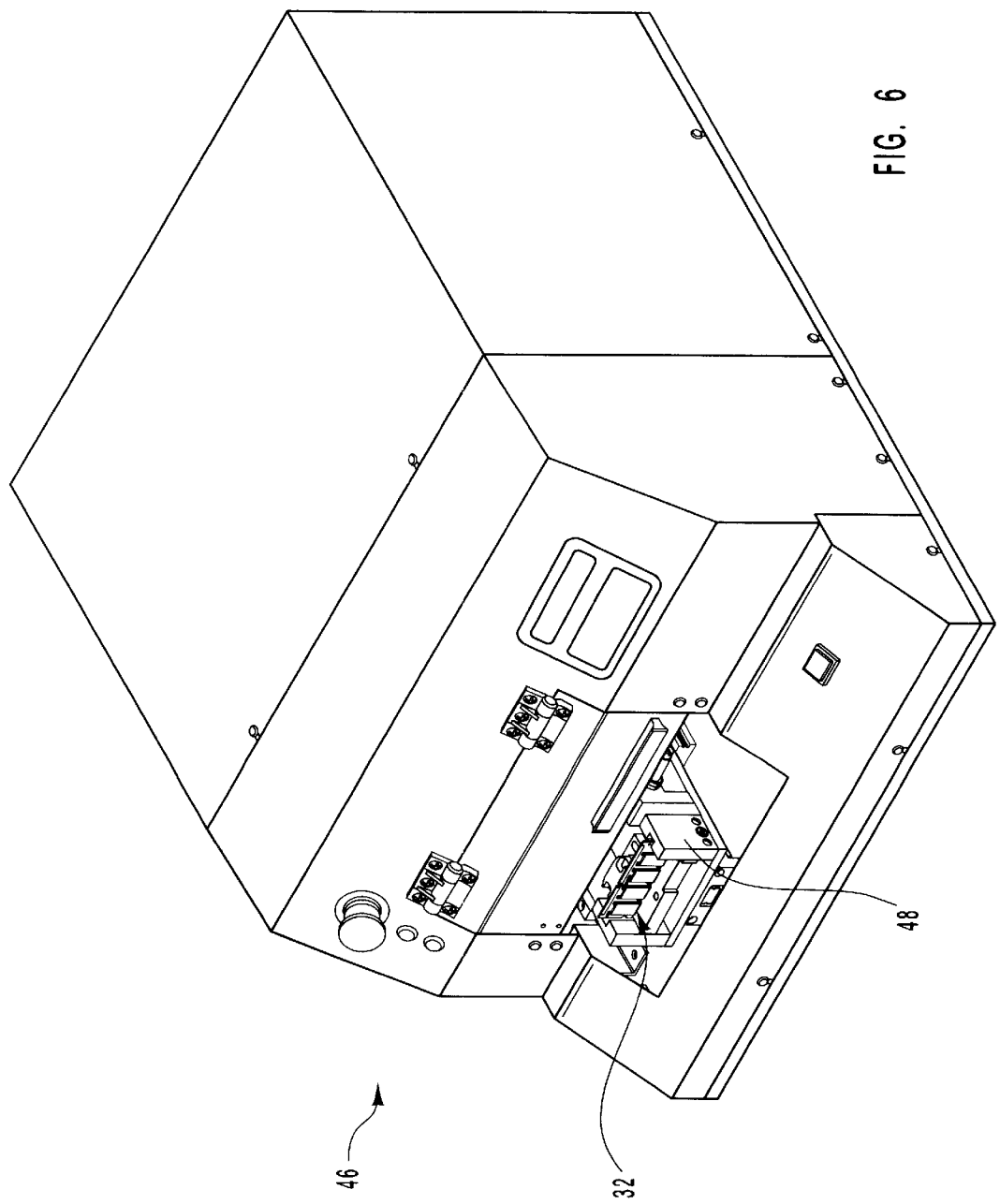
FIG. 6 is a perspective view of a cold roll bevel system according to the present invention.

FIG. 6 is a perspective view of a cold roll bevel system 46 according to the present invention. FIG. 6 illustrates the placement of memory module 32 into a memory module insert 48.

Figure 7:
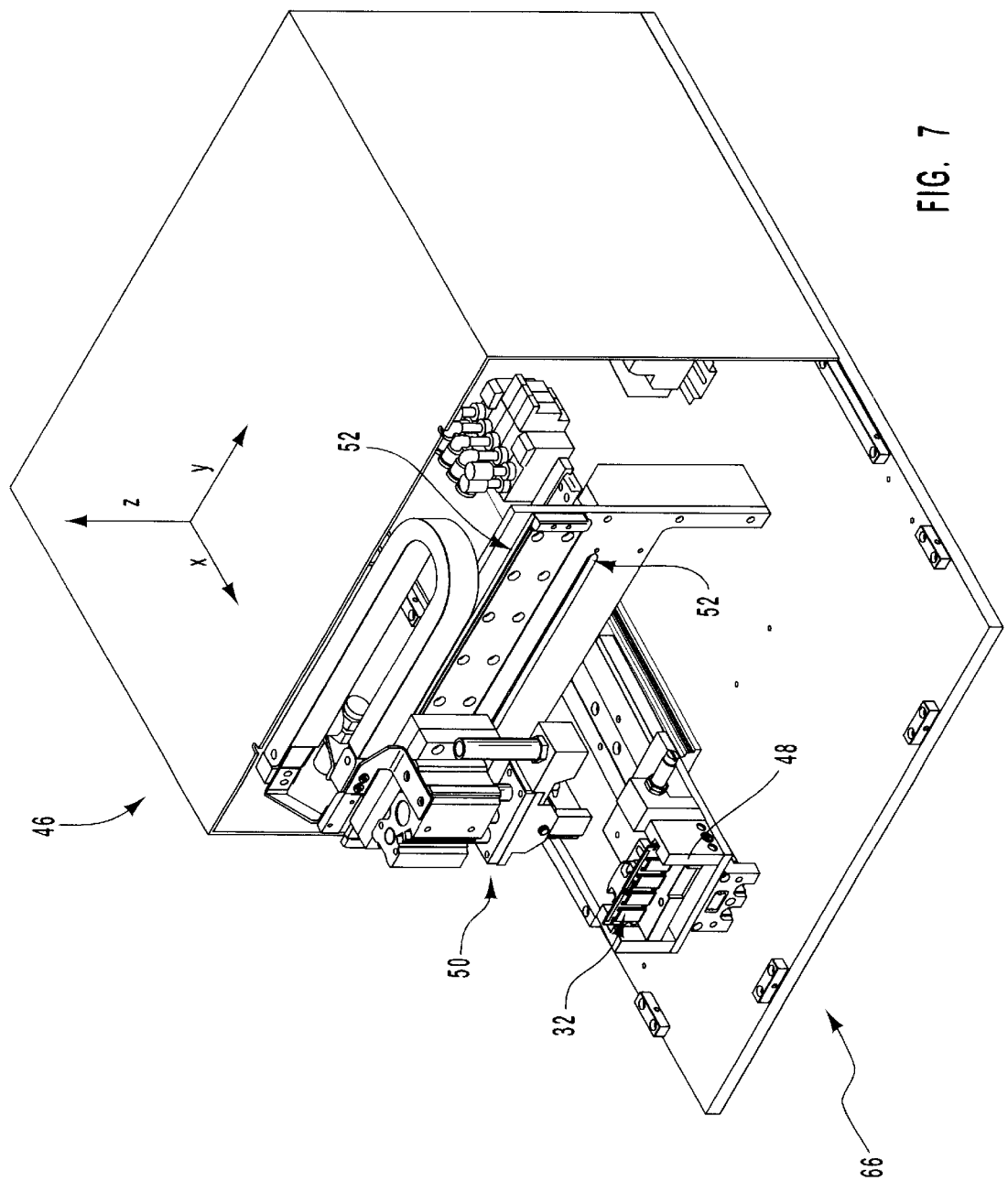
FIG. 7 is a perspective view of the inventive cold roll bevel system showing the bevel wheel carriage and the carriage track.
Figure 8:
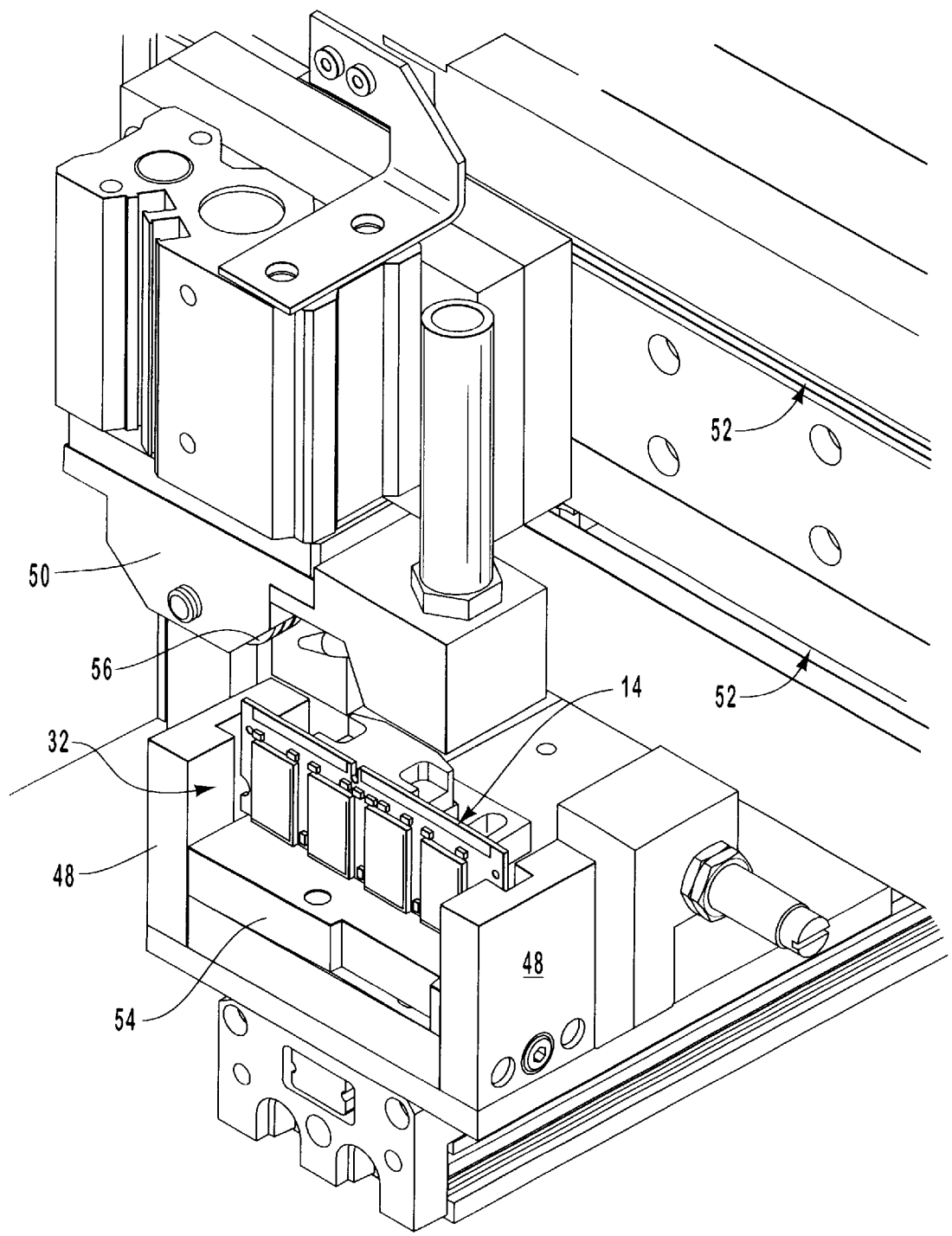
FIG. 8 is an alternative perspective view of the inventive cold roll bevel system showing the memory module affixed in a printed circuit board insert upon a plate.

FIG. 7 is a perspective view of an embodiment of the inventive cold roll bevel system 46 with a cover removed in order to better reveal memory module insert 48 and to reveal a bevel wheel carriage 50 that moves along a carriage track 52. FIG. 7 illustrates the placement of memory module 32 into memory module insert 48 and further illustrates that memory module insert 48 can be moved in an X-direction toward a front 66 of cold roll bevel system 46 where an operator may be stationed. After the placement of memory module 32 into memory module insert 48, memory module insert 48 is retracted away from front 66 of cold roll bevel system 46 to be aligned under bevel wheel carriage 50 in order to bevel insertion edge 14 of PCB 12 of memory module 32. FIG. 8 illustrates memory module 32 affixed in memory module insert 48. Memory module insert 48 comprises two parallel, opposed, spaced apart structures that are disposed against a plate 54 to hold plate 54 in a fixed position while an edge of the PCB is being shaped. These two parallel, opposed, spaced apart structures allows PCB 12 of memory module 32 to provide sufficient resistance to allow a bevel to be formed upon insertion edge 14. Memory module insert 48 including plate 54 have been retracted beneath bevel wheel carriage 50 in order to align a bevel wheel 56 with insertion edge 14.

Figure 9:
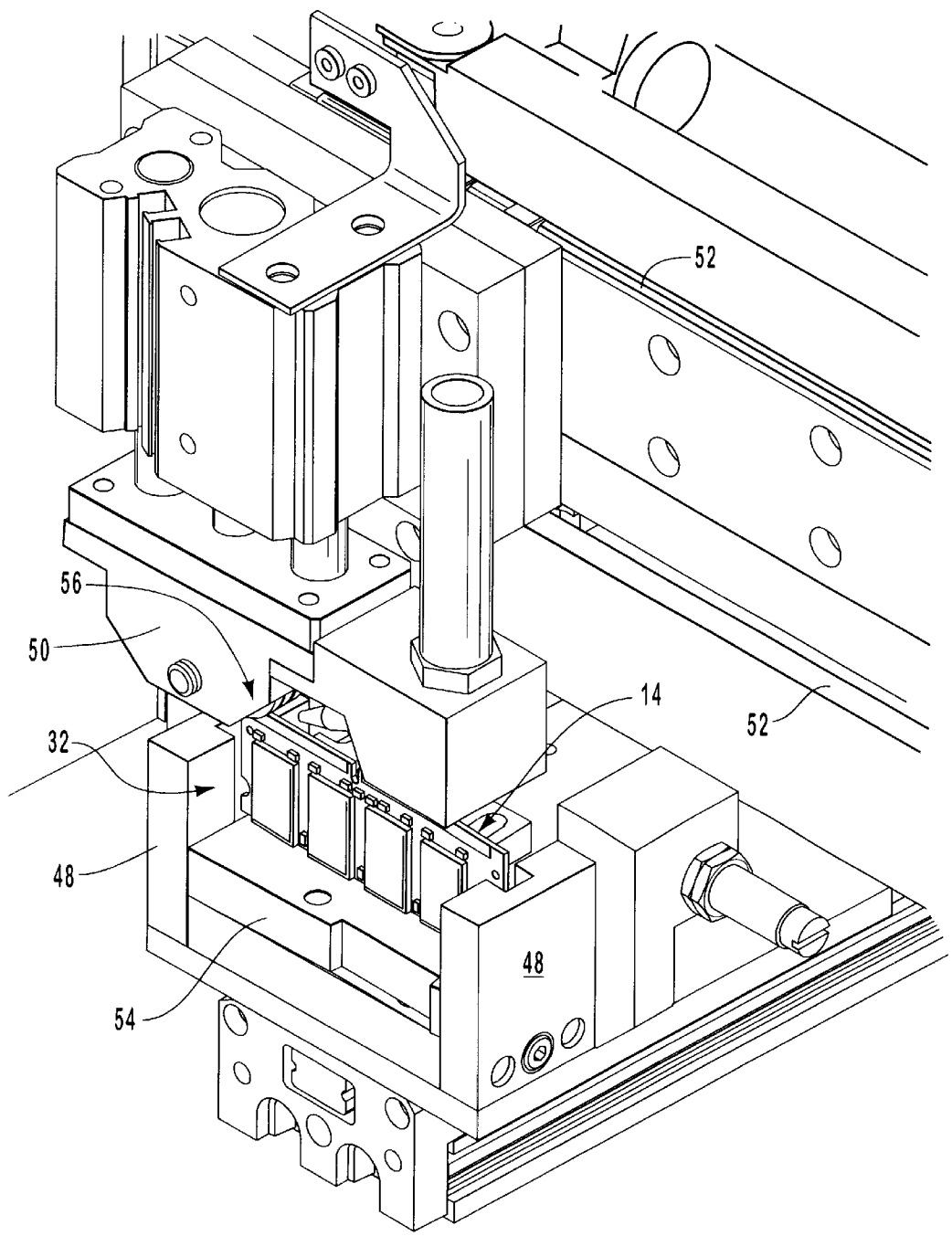
FIG. 9 is a perspective view of an embodiment of the inventive cold roll bevel system where the bevel wheel carriage has placed the bevel wheel onto the bevel edge of the memory module.

FIG. 9 shows that bevel wheel carriage 50 is adjusted in the Y and Z directions to place bevel wheel 56 directly upon insertion edge 14. In this configuration, bevel wheel carriage 50 is prepared to roll bevel wheel 56, in this embodiment from left to right with respect to FIG. 9 along insertion edge 14 in order to form dual beveled surfaces terminating at insertion edge 14.

Figure 10:
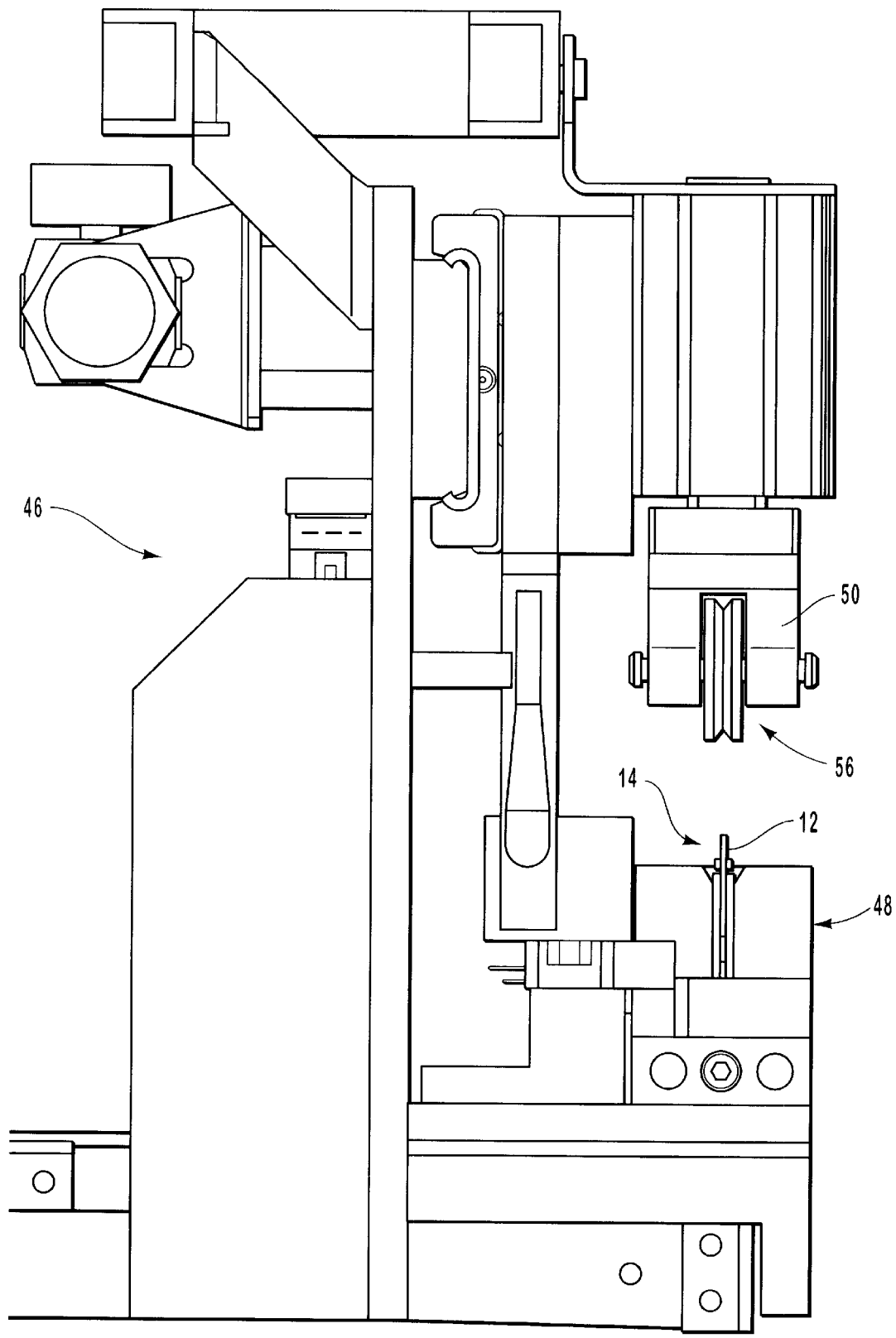
FIGS. 10 and 11 are elevational side views that demonstrates placement of the bevel wheel upon the bevel edge of the memory module in the inventive cold roll bevel system.
Figure 11:
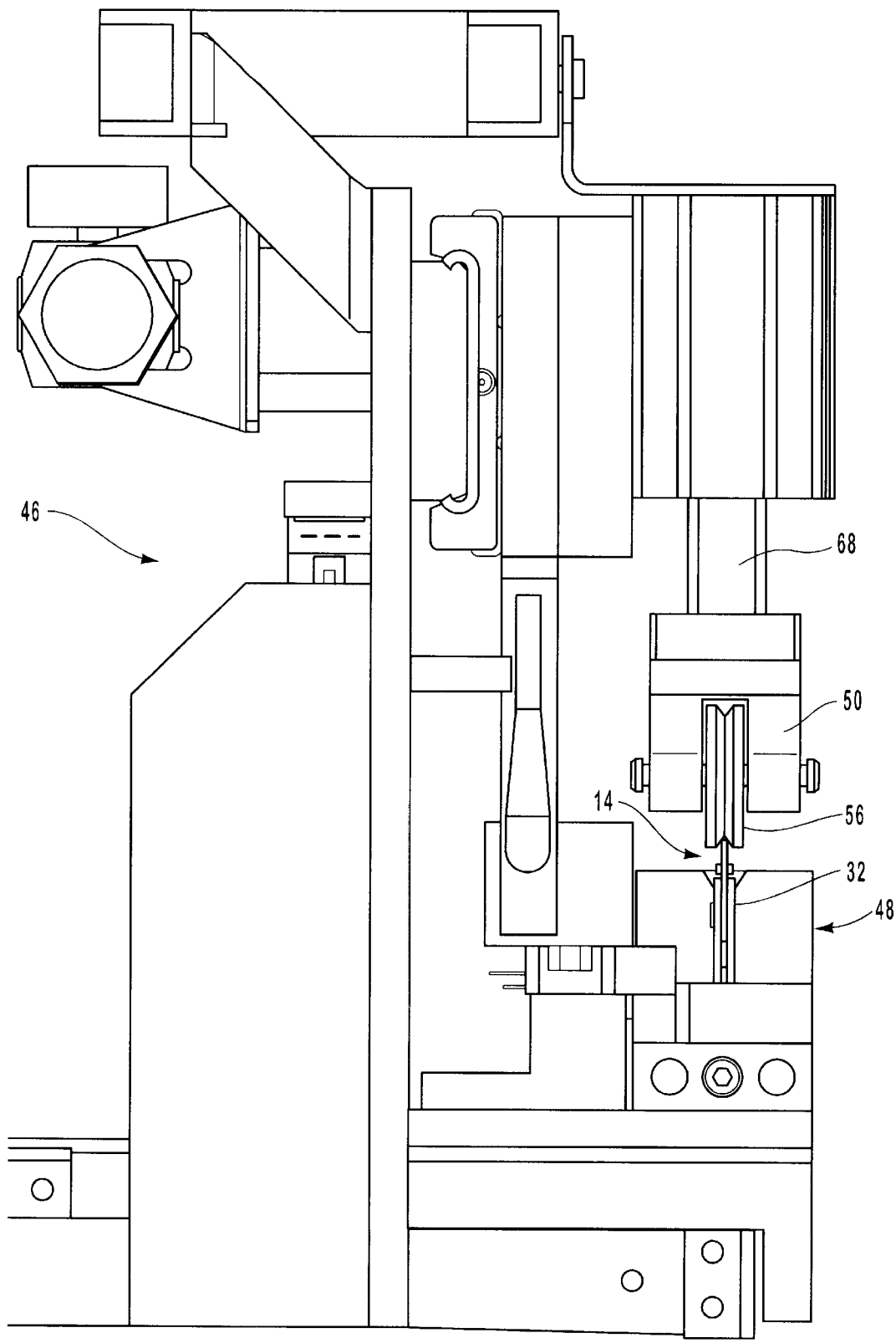

FIGS. 10 and 11 illustrate elevational side views that demonstrate the placement of bevel wheel 56 upon PCB 12. In FIG. 10, bevel wheel carriage 50 is illustrated as being retracted upwardly away from PCB 12 in memory module insert 48. In FIG. 11, bevel wheel carriage 50 has been pressed downwardly with respect to FIG. 12 by use of a piston 68 in order to position bevel wheel 56 upon PCB 12 of memory module 32 as it is affixed in memory module insert 48. Piston 68 or an equivalent displacement device, such as a shaft that is advanced by a rack and pinion gear, is actuated to place bevel wheel 56 onto insertion edge 14 of memory module 32.

The force that piston 68 applies upon insertion edge 14 of memory module 32 may be selected in order to achieve a preferred degree of faceting in the formation of the dual bevels. The pressure is preferably applied at a constant amount based upon the desired bevel shape. The height and the thickness of the printed circuit board will also influence the pressure. Preferably, the amount of pressure that is placed by bevel wheel 56 onto any given portion of memory module 32 along insertion edge 14 is in a range from about 15 psi to about 25 psi, preferably from about 18 psi to about 22 psi, and most preferably about 20 psi.

Figure 12:
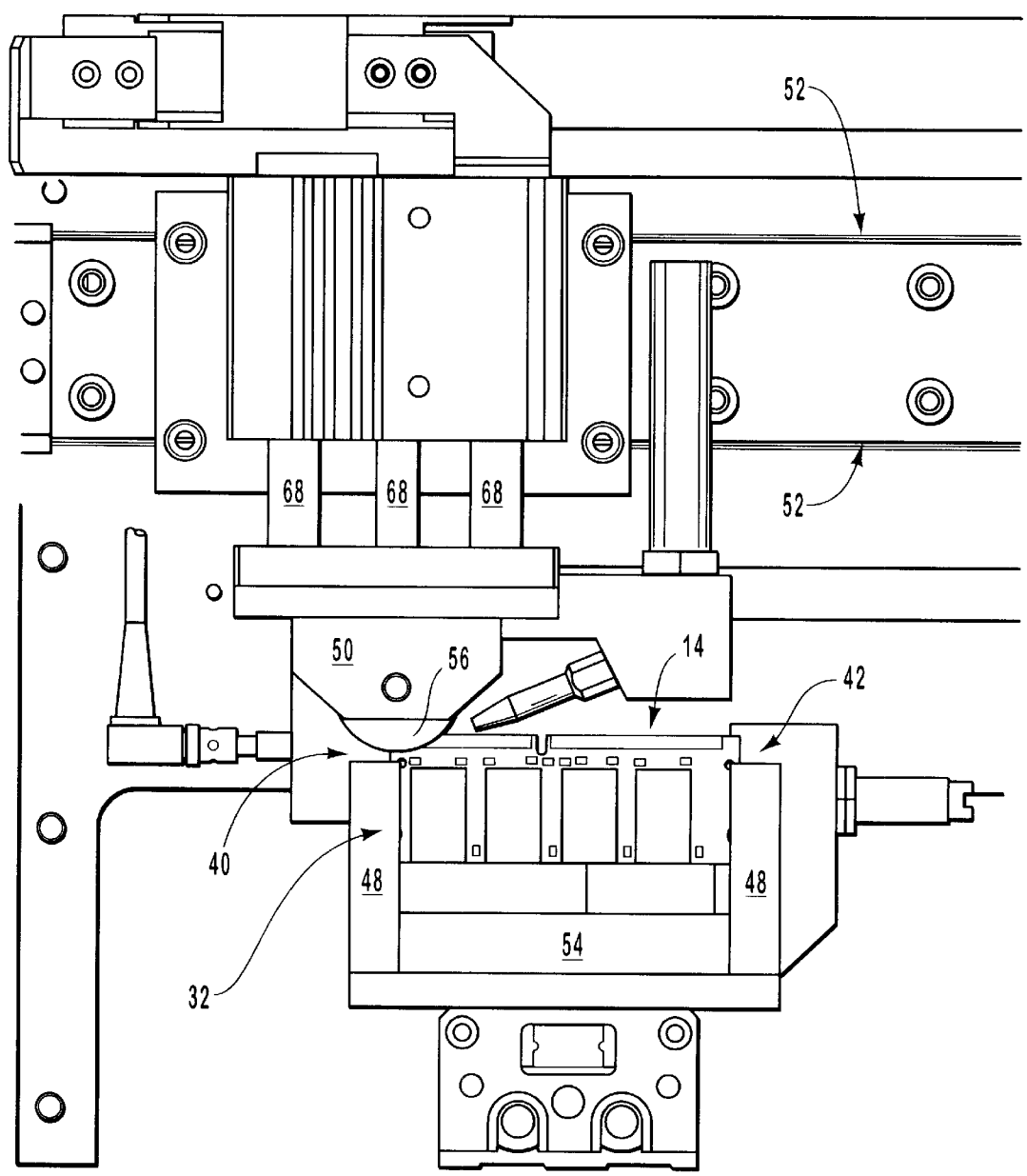
FIGS. 12 and 13 demonstrate the movement of the bevel wheel across the bevel edge of the memory module by the motion of the bevel wheel carriage in the inventive cold roll bevel system.
Figure 13:
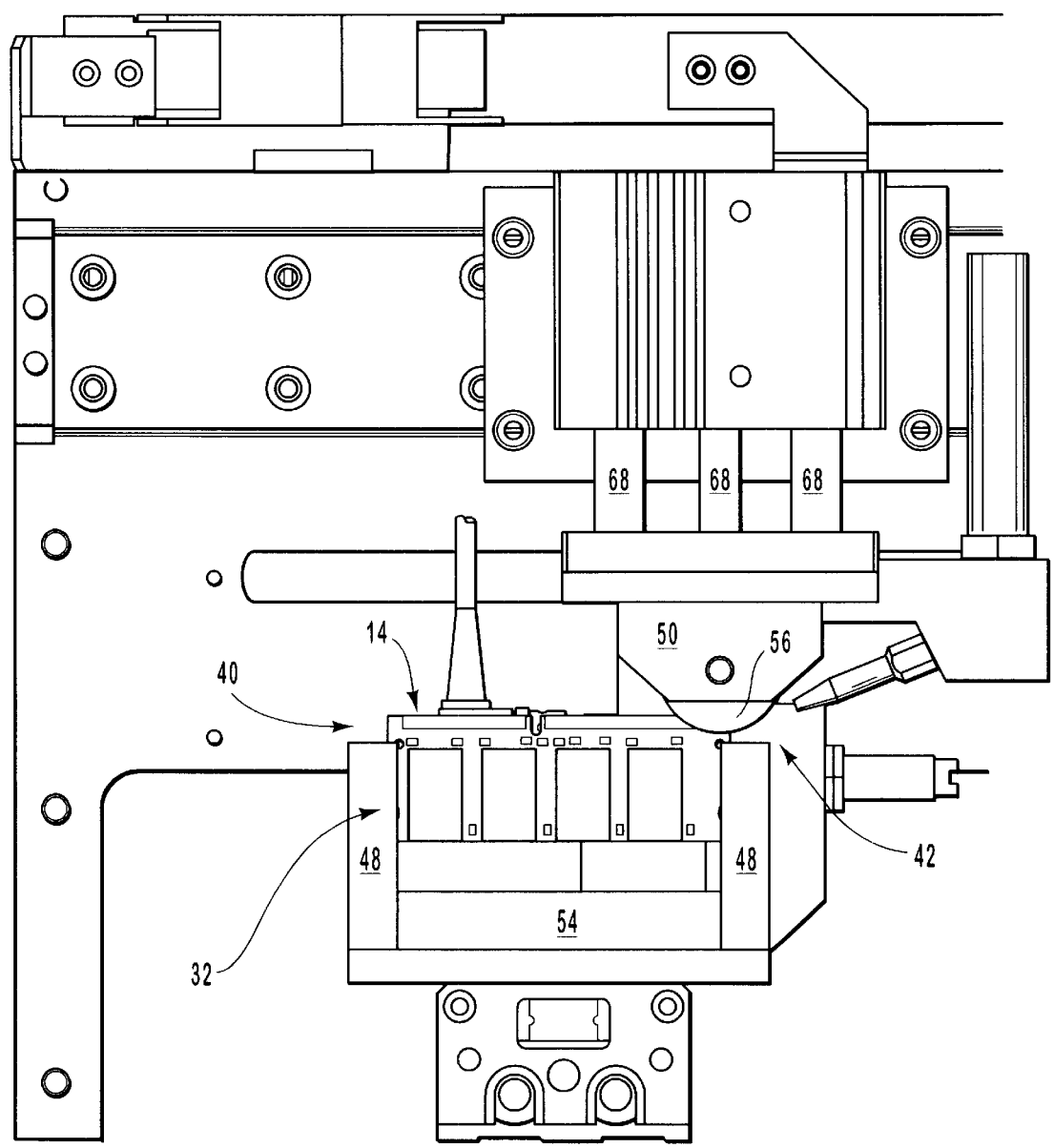

FIGS. 12 and 13 are elevational front views of the detail of the inventive cold roll bevel system 46, and further illustrate plate 54 and a pair of memory module inserts 48 that function to hold memory module 32. Bevel wheel 56 is illustrated as having made contact with memory module 32 upon insertion edge 14 near or at leading edge 40 of memory module 32. Under the preferred pressure of bevel wheel 56 applied upon insertion edge 14 at or near leading edge 40, bevel wheel carriage 50 is advanced from left to right with respect to FIG. 12 from leading edge 40 toward trailing edge 42. Bevel wheel carriage 50 advances along carriage track 52 under a preferred pressure in order to achieve a preferred bevel 44 (not pictured). FIG. 13 demonstrates the completion of motion of bevel wheel carriage 50 from left to right that causes bevel wheel 56 to roll along insertion edge 14 of memory module 32, beginning at leading edge 40 and ending at trailing edge 42. After the completion of the formation of bevel 44 (not pictured), piston 68 is retracted, thus retracting also bevel wheel carriage 50 and bevel wheel 56 away from insertion edge 14 of memory module 32.

Figure 14:
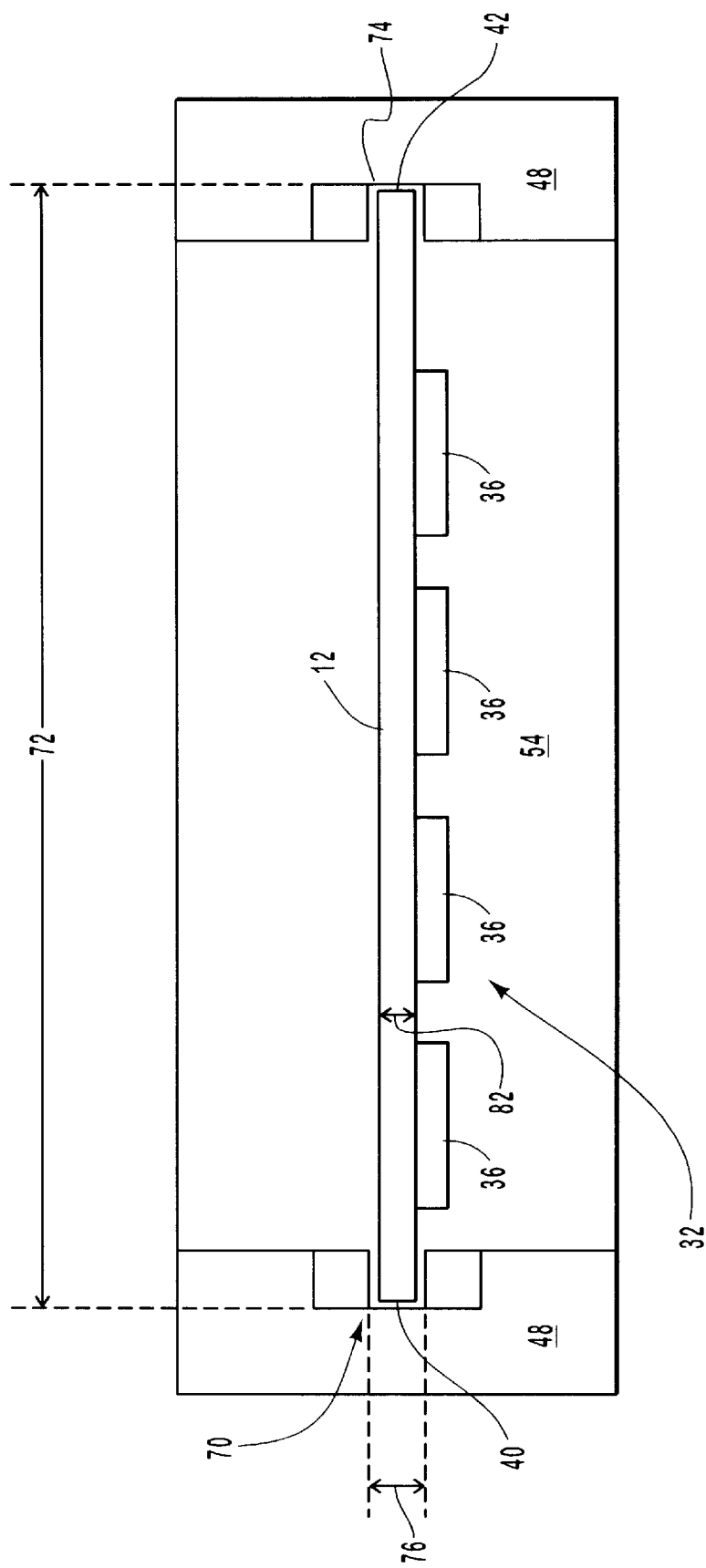
FIG. 14 is a plan view of a memory module inserted into a memory module insert that rests upon a plate.

FIG. 14 is a top plan view of memory module insert 48 and plate 54 holding memory module 32 within a leading notch 70 that holds leading edge 40 and a trailing notch 74 that holds trailing edge 42. As depicted in FIG. 14, each of leading notch 70 and trailing notch 74 has a width 76 and PCB 12 has a thickness 83. A clearance, which is defined as the difference between width 76 and thickness 82, is necessary so that PCB 12 that fits within either of leading notch 70 or trailing notch 72. The amount of clearance is preferably in a range from about 1 mil to about 20 mils, preferably from about 2 mils to about 16 mils, and more preferably about 10 mils.

The present invention is carried out by compressing insertion edge 14 at the juncture between insertion edge 14 and surface 30 as depicted in FIG. 3 by the method depicted in FIG. 5, to form bevels 44 as depicted in FIG. 4. The present invention may be carried out by having an operator manually place memory module 32 into memory module insert 48, or by placing memory module 32 using automated machinery. Length 72 may vary with the length of printed circuit boards 12. As such, memory module insert 48 may be connected to different sizes of plate 54 in order to accommodate different lengths of PCB 1212. An example of an industry standard PCB is a 72-pin printed circuit board. Where other lengths of PCB 12 may be larger or smaller, plate 54 may be changed to accommodate the length of a given PCB 12.

In the inventive method, an operator may bring a tray (not pictured) of memory modules 32, that may have as many as fifty memory modules or more per tray. The operator, or automated machinery, removes one memory module 32 from the tray and places it into memory module insert 48. A sensor may be placed at or near memory module insert 48 to confirm that memory module 32 has been inserted into notches 70, 74. Cold roll bevel system 46 then may move memory module insert 48 in the Y-direction to a position beneath bevel wheel carriage 50 in order to align bevel wheel 56 with insertion edge 14. Piston 68 then advances bevel wheel carriage 50 in order to allow bevel wheel 56 to contact insertion edge 14 as depicted in FIGS. 9, 10 and 11. Once bevel wheel 56 is placed at leading edge 40, bevel wheel carriage 50 is moved in the X-direction along insertion edge 14 toward trailing edge 42 as depicted in FIGS. 12 and 13. Following the formation of bevel 44, bevel wheel carriage 50 is retracted by the withdrawal of piston 68, memory module insert 48 is returned to its extended position, and memory module 32 may be removed from memory module insert 48.

Under certain conditions, a plurality of memory modules may be processed to form bevels on the insertion edge of the respective PCBs according to the present invention. In this embodiment, a plurality of parallel occurrences of bevel wheel 56 are mounted upon bevel wheel carriage 50 and a corresponding plurality of memory module inserts 48 are disposed beneath bevel wheel carriage 50. Each occurrence of bevel wheel 56 may have a separate sensor in order to apply a preferred even pressure force upon each occurrence of insertion edge 14.

In another embodiment of the present invention, the formation of bevel 44 may be carried out by inserting insertion edge 14 into a channel. When insertion edge 14 is forced through the channel, both surfaces 30 and insertion edge 14 will have a pair of bevels formed thereat. The shape of the bevels will have the same bevel height 62 and bevel angle 64 as depicted in FIG. 4. The shape of the channel may be substantially the same, when viewed in cross section, as the shape of bilaterally symmetrical channel 78 seen in FIG. 5. In this embodiment of using a channel instead of bevel wheel 56, the length of PCB 12 between opposing edges 40 and 42 must be taken into consideration in order to apply a pressure uniformly along insertion edge 14. As stated above, the preferred pressure is in a range from about 15 psi to about 25 psi, preferably from about 18 psi to about 22 psi, and most preferably about 20 psi. Accordingly, where the length of PCB 12 is shorter than a typical 72-pin memory module 32, the gross pressure applied by piston 68 will be less than where a full 72-pin memory module is being beveled.

In other embodiments of the present invention, bevel 44 may be formed by compressive forces that are brought bear by the articulation of a press. The press is thus used to form both bevel height 62 and bevel angle 64 as depicted in FIG. 4 according to a particular application. Such an articulating press, when in a closed position thereof, would be substantially the same as seen in FIG. 5, where the dashed line 82 represents the closed interface formed by two closed press platens of the press. Similarly to the foregoing channel embodiment, alterations of the articulating press pressure onto insertion edge 14 can be adjusted to achieve a desired result by application of a compressive force in the preferred pressure range stated above.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for shaping a PCB having a bottom edge that is opposite and parallel to an insertion edge that extends between opposing parallel surfaces of the PCB, the apparatus comprising:

a support surface for supporting the bottom edge of the PCB;

a device for moving a shaping tool to form a pair of bevels on the PCB without removing material from the PCB while:

the support surface supports the bottom edge of the PCB; and the shaping tool makes contact with:

the insertion edge of the PCB; and the opposing parallel surfaces of the PCB;

wherein each of the bevels extends between the insertion edge and a respective one of the opposing parallel surfaces of the PCB.

2. The apparatus as defined in claim 1, wherein the shaping tool forms said pair of bevels by applying a compressive force to:

the insertion edge of the PCB; and the opposing parallel surfaces of the PCB.

3. The apparatus as defined in claim 2, wherein applying a compressive force comprises simultaneously applying compressive force with the shaping tool to:

the insertion edge of the PCB; and the opposing parallel surfaces of the PCB.

4. The apparatus as defined in claim 1, wherein:

the PCB farther includes a leading edge that is opposite and parallel to a trailing edge;

the insertion edge extends between the leading edge and the trailing edge;

the shaping tool includes a wheel having a shaped surface thereon; and the pair of bevels on the PCB are formed by applying a compressive force to the PCB with the shaped surface of the wheel by rolling the shaped surface of the wheel against the PCB from the leading edge toward a trailing edge.

5. The apparatus as defined in claim 4, wherein the shaped surface of the wheel is rolled against the PCB from the leading edge toward a trailing edge while applying a compressive force therebetween in a range from about 15 psi to about 25 psi.

6. The apparatus as defined in claim 1, wherein:

the shaping tool includes a slot having a planar surface thereon; and the pair of bevels are formed by applying a compressive force to the PCB with the planar surface of the slot of the shaping tool.

7. The apparatus as defined in claim 1, wherein:

the shaping tool is an articulating press having a shaped surface thereon; and the pair of bevels are formed by moving the shaped surface to apply a compressive force to the insertion edge of the PCB and to one of the opposing parallel surfaces of the PCB.

8. The apparatus as defined in claim 1, wherein each of the bevels has a height in a range from about 20 thousandths of an inch to about 1 thousandths of an inch.

9. The apparatus as defined in claim 8, wherein the height of each of the bevels is a range from about 4 thousandths of an inch to about 7 thousandths of an inch.

10. The apparatus as defined in claim 1, wherein each of the bevels is a plane that forms an angle with respect to the insertion edge in a range from about 15° to about 60°.

11. The apparatus as defined in claim 1, wherein each of the bevels are a plane that forms an angle with respect to the insertion edge in a range from about 20° to about 40°.

12. The apparatus as defined in claim 1, further comprising:

a pair of opposite parallel plates for securing the PCB therebetween while the shaping tool forms the pair of bevels.

13. The apparatus as defined in claim 1, wherein:

the PCB further includes a leading edge that is opposite and parallel to a trailing edge; and the apparatus further comprising:

a pair of opposite parallel plates respectively compressing the leading edge and the trailing edge for securing the PCB therebetween while the shaping tool forms the pair of bevels.

14. The apparatus as defined in claim 1, wherein said shaping tool comprises a shaped channel for receiving said insertion edge.

15. The apparatus as defined in claim 1, wherein said shaping tool comprises an articulating press.

16. An apparatus for shaping a PCB having a bottom edge that is opposite and parallel to an insertion edge that extends between opposing parallel surfaces of the PCB, the PCB also including a leading edge that is opposite and parallel to a trailing edge, wherein the insertion edge extends between the leading edge and the trailing edge, the apparatus comprising:

a support surface for supporting the bottom edge of the PCB;

a pair of opposite parallel plates;

a device for moving a shaping tool from the leading edge to the trailing edge to form a pair of bevels on the PCB while:

the support surface supports the bottom edge of the PCB;

the pair of opposite parallel plates contacts the leading edge and the trailing edge to secure the PCB therebetween; and the shaping tool makes contact with:

the insertion edge of the PCB; and the opposing parallel surfaces of the PCB;

wherein:

the shaping tool forms the pair of bevels by applying a compressive force to the PCB without removing material from the PCB; and each of the bevels extends between the insertion edge and a respective one of the opposing parallel surfaces of the PCB.

17. The apparatus as defined in claim 16, wherein:

the shaping tool includes a wheel having a shaped surface thereon; and the pair of bevels on the PCB are formed by applying the compressive force to the PCB with the shaped surface of the wheel by rolling the shaped surface of the wheel against the PCB from the leading edge toward a trailing edge.

18. An apparatus as defined in claim 16, wherein the shaped surface on the wheel comprises a bilaterally symmetrical angle channel.

19. An apparatus as defined in claim 18, the wheel is affixed to a wheel carriage, wherein the wheel carriage is affixed to a piston, and wherein the wheel carriage is disposed along a carriage track for moving the shaping tool from the leading edge to the trailing edge.

20. The apparatus as defined in claim 16, wherein the shaped surface of the wheel is rolled against the PCB from the leading edge toward a trailing edge while applying the compressive force therebetween in a range from about 15 psi to about 25 psi.

21. The apparatus as defined in claim 16, wherein:

the shaping tool includes a slot having a pair of planar surfaces thereon; and the pair of bevels are formed by applying the compressive force to the PCB with the pair of planar surfaces of the slot of the shaping tool.

22. The apparatus as defined in claim 16, wherein:

the shaping tool is an articulating press having a pair of shaped surfaces thereon; and the pair of bevels are formed by moving the pair of shaped surfaces to apply said compressive force to the insertion edge of the PCB, and wherein a respective pair of shaped surfaces of the articulating press applies said compressive force to a respective one of the opposing parallel surfaces of the PCB.

23. The apparatus as defined in claim 16, wherein each of the pair of bevels has a height in a range from about 20 thousandths of an inch to about 1 thousandths of an inch.

24. The apparatus as defined in claim 23, wherein the height of each of the bevels is in a range from about 4 thousandths of an inch to about 7 thousandths of an inch.

25. The apparatus as defined in claim 16, wherein each of the bevels is a plane that forms an angle with respect to the insertion edge in a range from about 15° to about 60°.

26. The apparatus as defined in claim 16, wherein each of the bevels is a plane that forms an angle with respect to the insertion edge in a range from about 20° to about 40°.

27. An apparatus for shaping a PCB having a bottom edge that is opposite and parallel to an insertion edge that extends between opposing parallel surfaces of the PCB, the apparatus comprising:

a support surface for supporting the bottom edge of the PCB;

a device for moving a shaping tool to form a pair of bevels on the PCB without removing material from the PCB while:

the support surface supports the bottom edge of the PCB; and the shaping tool makes contact with:

the insertion edge of the PCB; and the opposing parallel surfaces of the PCB;

wherein said shaping tool comprises a wheel having a shaped surface thereon for rolling contact engagement with the PCB.

28. The apparatus as defined in claim 27, wherein said wheel has a bilaterally symmetrical angled channel shape for receiving said insertion edge.

29. The apparatus as defined in claim 27, further comprising a piston such that said contact engagement takes place at a pressure, and said pressure is regulated by said piston.

* * * * *

UNITED STATES PATENT AND TRADEMARK OFFICE
CERTIFICATE OF CORRECTION

PATENT NO.    : 6,655,950 B2
DATED         : December 2, 2003
INVENTOR(S)   : Refugio C. Morales It is certified that error appears in the above-identified patent and that said Letters Patent is hereby corrected as shown below:

Column 9,
Line 4, change "farther" to -- further --

Signed and Sealed this

Sixteenth Day of March, 2004

JON W. DUDAS
*Acting Director of the United States Patent and Trademark Office*